United States Patent
Lee

(10) Patent No.: US 7,959,993 B2
(45) Date of Patent: Jun. 14, 2011

(54) SMALL MOLECULAR ORGANIC ELECTROLUMINESCENT DISPLAY DEVICE AND METHOD OF FABRICATING THE SAME

(75) Inventor: Jun-Yeob Lee, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/385,309

(22) Filed: Apr. 3, 2009

(65) Prior Publication Data
US 2009/0197497 A1 Aug. 6, 2009

Related U.S. Application Data

(62) Division of application No. 11/272,680, filed on Nov. 15, 2005, now Pat. No. 7,579,772.

(30) Foreign Application Priority Data

Nov. 17, 2004 (KR) .......................... 10-2004-0094365

(51) Int. Cl.
*B41M 5/46* (2006.01)
(52) U.S. Cl. ..................... 428/32.81; 156/235; 428/690; 430/945
(58) Field of Classification Search .................. None
See application file for complete search history.

(56) References Cited

U.S. PATENT DOCUMENTS

| | | | |
|---|---|---|---|
| 6,392,250 B1 | 5/2002 | Aziz | |
| 6,699,597 B2 | 3/2004 | Bellmann et al. | |
| 7,045,952 B2 | 5/2006 | Lu | |
| 7,175,922 B2 | 2/2007 | Jarikov et al. | |
| 7,271,406 B2 * | 9/2007 | Bentsen et al. | 257/40 |
| 7,507,485 B2 * | 3/2009 | Oh et al. | 428/690 |
| 7,517,593 B2 * | 4/2009 | Song et al. | 428/690 |

FOREIGN PATENT DOCUMENTS

| | | |
|---|---|---|
| CN | 1416301 A | 5/2003 |
| CN | 1453886 | 11/2003 |
| JP | 10-208881 A | 8/1998 |
| JP | 2003-068466 | 3/2003 |
| JP | 2003-347058 | 5/2003 |
| JP | 2003-229258 | 8/2003 |
| JP | 2003-229259 | 8/2003 |
| JP | 2004-071550 | 3/2004 |
| KR | 10-2003-0097363 | 12/2003 |

OTHER PUBLICATIONS

Chinese Patent Registration Gazette issued on Dec. 2, 2009 in the corresponding Chinese Patent Application No. 200510123312.2.
Korean Office Action of the Korean Patent Application No. 2004-0094365, issued on Jun. 20, 2006.

(Continued)

*Primary Examiner* — Bruce H Hess
(74) *Attorney, Agent, or Firm* — Robert E. Bushnell, Esq.

(57) ABSTRACT

An organic electroluminescent display (OELD) device and a method of fabricating the same are disclosed. The OELD device includes a substrate, a first electrode, an organic layer containing at least one light emitting layer, and a second electrode. The light emitting layer is comprised of at least one phosphorescent dopant and at least two host materials.

14 Claims, 4 Drawing Sheets

OTHER PUBLICATIONS

Office action from Japanese Patent Office issued in Applicant's corresponding Japanese Patent Application No. 2005-151497 dated Jun. 3, 2008.

Office action from the State Intellectual Property Office of P.R. China issued in Applicant's corresponding Chinese Patent Application No. 200510123312.2 dated Oct. 17, 2008 (submitted with an English translation).

Transmittal letter and Japanese Office Action issued by Japanese Patent office on Sep. 15, 2009 in the corresponding Japanese Patent Application No. 2005-151497 with English abstract attached.

* cited by examiner

SMALL MOLECULAR ORGANIC ELECTROLUMINESCENT DISPLAY DEVICE AND METHOD OF FABRICATING THE SAME

CLAIM OF PRIORITY

This application claims the benefit of Korean Patent Application No. 10-2004-0094365, filed Nov. 17, 2004, the disclosure of which is hereby incorporated herein by reference in its entirety. Furthermore, this application is a divisional of Applicants' Ser. No. 11/272,680 now U.S. Pat. No. 7,579,772 filed in the U.S. Patent & Trademark Office on 15 Nov. 2005, and assigned to the assignee of the present invention.

BACKGROUND OF THE INVENTION

1. Field of the Invention

The present invention relates to an organic electroluminescent display ("OELD") device and a method of fabricating the same and, more particularly, to a small molecular OELD device which is fabricated by using a mixture of a phosphorescent dopant and at least two hosts and a method of fabricating the same.

2. Description of the Related Art

As consumers want to get information faster and more precisely with the advent of information era, development on display devices which are light and convenient to carry and have fast processing speed has been rapidly carried out. Of these display devices, an OELD device is a self-light-emitting device which electrons and holes are recombined in an organic light emitting layer if a voltage is applied to an organic layer having the organic light emitting layer and so requires no backlight which is used in a liquid crystal display (LCD) device. Therefore, it has advantages as a next generation display device in that it is thin and light, has a simplified process, and has features of a response speed of the same level as a cathode ray tube (CRT), a low voltage driving, a high luminous efficiency and a wide viewing angle.

The OELD device is classified into a small molecular OELD device and a polymer OELD device according to a material of an organic light emitting layer.

The polymer OELD device may have a single layer structure comprised of an organic light emitting layer between an anode and a cathode or a dual layer structure which further including a hole transporting layer, and thus a thin OELD device can be fabricated. However, it has a disadvantage in that it is low in stability and has short life span compared to the small molecular OELD device. In case where one kind of material is employed as a light emitting material, the small molecular OELD device are low in color purity and luminous efficiency, and thus a host-dopant combination is used to increase the color purity and the luminous efficiency through an energy transfer. Here, the host which contains a carbazole unit as a host material, i.e., a small molecular material has a disadvantage in that it is easily crystallized by heat which may be generated during a device operation, destroying the device.

In the fabricating process of the OELD device, in case where one color device is fabricated, the OELD device having a polymer can be simply fabricated using a spin coating process. However, it is inferior in life span and efficiency to the small molecular OELD device. The small molecular OELD device is more excellent in device characteristics than the polymer OELD device but is fabricated through a complicated fabricating process using a deposition process.

In case of a full color device, light emitting layers which represent red (R), green (G) and blue (B) colors are patterned to implement a full color, and the patterning of the light emitting layers is carried out by an ink jet printing or laser induced thermal imaging (hereinafter will be referred to as "LITI"). The LITI can use a spin coating characteristic "as is" and so has high pixel inside uniformity even in case of a large-sized device. The LITI is not a wet etching technique but a dry etching technique, and so it can resolve a problem caused by a solvent which may lower a device life span, and it can finely pattern the organic layer. In case where a plurality of organic layers having at least a light emitting layer are stacked using a deposition process and a full color is implemented using a shadow mask in the small molecular OELD device, the light emitting layers which implement R, G and B colors are stacked and patterned. In such an instance, a device life span of the small molecular OELD device is more excellent than that of the polymer OELD device, since the multiple layers are formed using a deposition process, but a fabricating process is more complicated because the R, G and B light emitting layers are stacked on respective pixel regions using the shadow mask to implement the full color. In addition, in case of fabricating the large-sized device, the shadow mask may be sagged, leading to misalignment. Further, since a space between the masks may be contaminated, it should be frequently cleaned, which checks a size increasing of device and a mass production. As described above, the small molecular OELD device is excellent in device characteristics but is complicated in fabricating process compared to the polymer OELD device. In order to resolve the problems, a method of fabricating the small molecular OELD device using the LITI has been introduced, so that a device having excellent characteristics and large pixel region can be simply fabricated. As described above, however, in case where the small molecular OELD device is fabricated using the LITI, there is a problem in that the small molecular material is easily crystallized by heat.

SUMMARY OF THE INVENTION

It is an object of the present invention to provide an improved OELD device.

It is another object of the present invention to provide an improved method for making an OELD device.

It is also an object of the present invention to provide an improved donor substrate for laser induced thermal imaging.

It is a further object of the present invention to provide an OELD device which can prevent device characteristics from being degraded due to crystallization which may occur during a device operation.

It is yet another object of the present invention to provide a method of fabricating an OELD device which provides a donor substrate which can prevent transfer characteristics from being degraded due to crystallization occurrence and uses the donor substrate.

In order to achieve the above objects, the present invention provides an organic electroluminescent display device, including: a substrate; a first electrode formed on the substrate; an organic layer formed on the first electrode, the organic layer containing at least one light emitting layer, the light emitting layer comprising at least one phosphorescent dopant and at least two host materials including a first host material and a second host material; and a second electrode formed on the organic layer.

The present invention further provides a method of fabricating an organic electroluminescent display device, including: preparing a target substrate; and forming an organic layer on the target substrate, the organic layer including at least a light emitting layer, the organic layer comprising at least one phosphorescent dopant, a first host material, and a second host material.

It is preferred that the target substrate includes an insulating substrate, a first electrode on the insulating substrate, and a pixel defining layer on the first electrode, and the step of forming the organic layer includes: preparing a donor substrate comprising a base layer, a light-to-heat conversion layer formed on the base layer, and a transfer layer formed on the light-to-heat conversion layer, the transfer layer comprising at least one phosphorescent dopant, a first host material and a second host material; positioning the transfer layer of the donor substrate to face the pixel defining layer of the target substrate; and irradiating a predetermined region of the donor substrate with laser to transfer the transfer layer to the target substrate.

The present invention further provides a donor substrate, including: a base layer; a light-to-heat conversion layer formed on the base layer; and a transfer layer formed on the light-to-heat conversion layer, wherein the transfer layer includes at least one phosphorescent dopant, a first host material and a second host material.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1A:
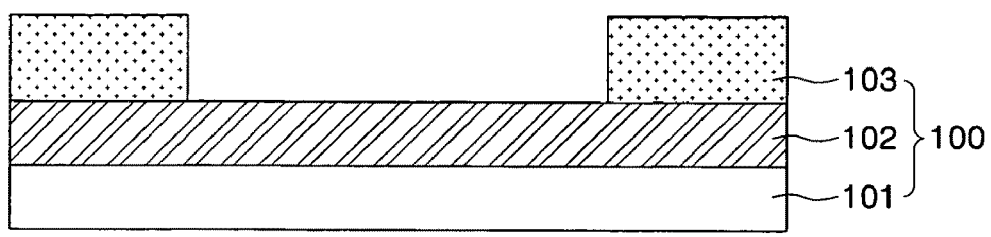
FIGS. 1A to 1D are cross-sectional view illustrating a process of fabricating an OELD device according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIGS. 1A to 1D are cross-sectional view illustrating a process of fabricating an OELD device according to an embodiment of the present invention.

As shown in FIG. 1A, a substrate (preferably an insulating substrate 101) is provided, and a first electrode 102 is patterned and formed on the substrate 101.

Here, the first electrode 102 may be one of an anode and a cathode. In case where the first electrode 102 is the anode, the first electrode 102 is made of a material having high work function. For example, the first electrode 102 may be a transparent electrode made of indium tin oxide (ITO) or indium zinc oxide (IZO) or a reflecting electrode which is made of one selected a group comprised of Pt, Au, Ir, Cr, Mg, Ag, Ni, Al, and an alloy of these. In case where the first electrode 102 is the cathode, it is made of a material having low work function. For example, it may be a thin transparent electrode or a thick reflecting electrode which is made of one selected from a group comprised of Mg, Ca, Al, Ag, Ba, and an alloy of these.

Subsequently, a pixel defining layer 103 is formed on the first electrode 102 to thereby define R, G and B pixel regions, thereby completing a substrate 100 (i.e., target substrate).

FIG. 1A shows a sub pixel of the OELD device. A plurality of the sub pixels may be arranged, and even thought not shown, the substrate 100 may further contain a plurality of thin film transistors (TFTs), a plurality of insulating layers and a plurality of capacitors.

An organic layer having at least a light emitting layer is formed on the first electrode in the pixel region. The light emitting layer is preferably formed of a mixture of a phosphorescent dopant and at least two host materials including a first host material and a second host material.

The first host material is a small molecular material which is typically used to transfer energy to the phosphorescent dopant. For example, the first host material may be one selected from a group comprised of carbazoles, arylamines, hydrazones, and starbursts. Preferably, the first host material may be one selected from a group comprised of 1,3,5-triscarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tris(2-carbazolylphenyl)benzene, 1,3,5-tris(2-carbazolyl-5-methoxyphenyl)benzene, and bi(4-carbazolylphenyl)silane.

Here, the first host material has a disadvantage in that it may be easily crystallized by heat and thus may lower device characteristics.

Thus, the second host material can suppress crystallization of the first host material and contains an amorphous material. Since the first host material typically has hole transporting characteristic, the second host material has an electron transporting characteristic, thereby improving device efficiency. For example, the second host material may be one selected from a group comprised of an organic metal, oxadiazoles, triazoles, triazines, and spirofluorenes. The organic metal contains one of Al, Zn, Be, Ga, and Al and for example, may be one selected from a group comprised of bis(8-hydroxyquinolato)biphenoxy aluminum, bis(8-hydroxyquinolato) phenoxy aluminum, bis(2-methyl-8-hydroxyquinolato)biphenoxy aluminum, bis(2-methyl-8-hydroxyquinolato) phenoxy aluminum, and bis(2-(2-hydroxyphenyl)quinolato) zinc. The oxadiazoles may be (4-biphenylyl)-5-(4-tertbutylphenyl)-1,3,4-oxadiazole. The triazoles may be 3-phenyl-4-(1'-naphthyl)-5-phenyl-1,2,4-triazole, and the triazines may be 2,9-dimethyl-4,7-diphenyl-9,10-phenanthroline and 2,4,6-tris(diallylamino)-1,3,5-trazin. The spirofluorenes may be 1,4-bisspirofluorenylbenzene.

Thus, the crystallization of the first host material can be prevented by the second host material.

The second host material may have weight ratio of 0.1 to 10 with respect to the first host material having weight ratio of 1. If the second host material having weight ratio of less than 0.1 is mixed with the first host material having weight ratio of 1, the first host material may be crystallized, where if the second host material having weight ratio of more than 10 is mixed with the first host material having weight ratio of 1, the second host material may be crystallized. Preferably, in order to improve the device characteristics, the second host material has weight ratio of 0.3 to 3 with respect to the first host material having weight ratio of 1.

The phosphorescent dopant may be formed of an organic metal complex containing one selected from a group comprised of Pt, Ir, Tb, Pt, and Eu.

Accordingly, by using the mixture of the first host material having the hole transporting characteristic and the second host material having the electron transporting characteristic, efficiency and life span of the device can be improved. In the completed device, since the second host material which suppresses crystallization occurrence is added, device characteristic degradation and device damage which may result from crystallization can be prevented.

The light emitting layer may be formed using one of a LITI, a vacuum deposition, a spray coating, and an ink jet printing. Preferably, the light emitting layer is formed using the LITI.

Since the LITI uses the spin coating characteristic, the light emitting layer can have high uniformity of the inside of the pixel in case of a large sized device. The LITI is not a wet etching technique but a dry etching technique, and so it can resolve a problem caused by a solvent which lowers a device life span, and it can finely pattern the organic layer.

Figure 1B:
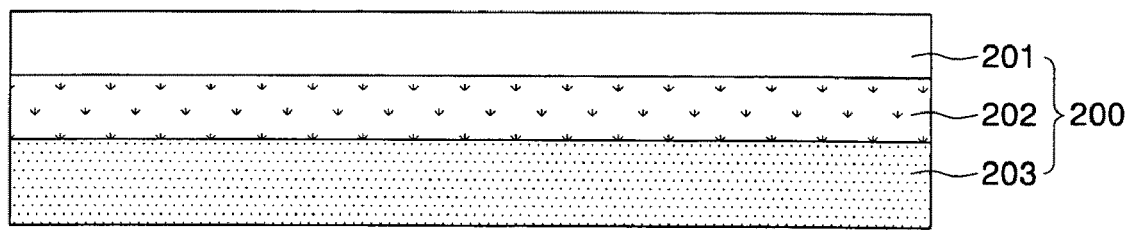
Figure 1B:
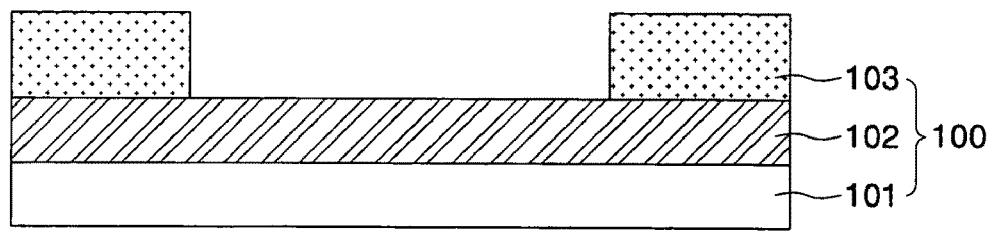

A process of forming the light emitting layer using the LITI is explained below with reference to FIG. 1B.

The substrate 100 is provided, and then a donor substrate 200 in which a light-to-heat conversion layer 202 and a transfer layer 203 are stacked on a base layer 201 is located such that the pixel region on the first electrode faces the transfer layer 203 of the donor substrate and then is laminated.

The base layer 201 is preferably made of a transparent material because a laser is irradiated to the base layer 201 and transferred to the light-to-heat conversion layer 202. The base layer 201 may be a polymer material layer preferably containing at least one selected from a group comprised of polyester, polyacryl, polyepoxy, polyethylene, and polystyrene or a glass substrate. More preferably, the base layer 201 is made of polyethylene terephthalate.

The light-to-heat conversion layer 202 formed on the base layer 201 absorbs light of infrared ray-visible ray region and converts part of the light to heat, and should have appropriate optical density and contains a light absorbing material of absorbing light. The light-to-heat conversion layer 202 is formed of a metal layer comprised of Al, Ag, oxide of these or sulfide of these or an organic layer comprised of a polymer containing carbon black, graphite, or infrared ray colorant. The metal layer may be formed using a vacuum deposition, an electron beam or a sputtering, and the organic layer may be formed using a roll coating method, a gravure method, an extruding method, a spin coating method, or a knife coating method as a typical film coating method.

The transfer layer 203 formed on the light-to-heat conversion layer 202 may be formed such that a phosphorescent dopant and at least two host materials are mixed and then the mixture is coated or deposited using a spray coating method, a dip coating method, a gravure coating method, a roll coating method, a spin coating method, or a vacuum depositing method.

The host material preferably includes a first host material and a second host material.

The first host material is a small molecular material which is typically used to transfer energy to the phosphorescent dopant. For example, the first host material may be one selected from a group comprised of carbazoles, arylamines, hydrazones, and starbursts. Preferably, the first host material may be one selected from a group comprised of 1,3,5-triscarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine, 1,3,5-tris(2-carbazolylphenyl)benzene, 1,3,5-tris(2-carbazolyl-5-methoxyphenyl)benzene, and bi(4-carbazolylphenyl)silane.

Here, the first host material has a disadvantage in that it may be easily crystallized by heat and thus may lower device characteristics.

Thus, the second host material can suppress crystallization of the first host material and contains an amorphous material. Preferably, the second host material has electron transporting characteristic, thereby improving device efficiency. For example, the second host material may be one selected from a group comprised of an organic metal, oxadiazoles, triazoles, triazines, and spirofluorenes. The organic metal contains one of Al, Zn, Be, Ga, and Al and for example, may be one selected from a group comprised of bis(8-hydroxyquinolato) biphenoxy aluminum, bis(8-hydroxyquinolato)phenoxy aluminum, bis(2-methyl-8-hydroxyquinolato)biphenoxy aluminum, bis(2-methyl-8-hydroxyquinolato)phenoxy aluminum, and bis(2-(2-hydroxyphenyl)quinolato) zinc. The oxadiazoles may be (4-biphenylyl)-5-(4-tertbutylphenyl)-1,3,4-oxadiazole. The triazoles may be 3-phenyl-4-(1'-naphthyl)-5-phenyl-1,2,4-triazole, and the triazines may be 2,9-dimethyl-4,7-diphenyl-9,10-phenanthroline and 2,4,6-tris(diallylamino)-1,3,5-trazin. The spirofluorenes may be 1,4-bisspirofluorenylbenzene.

Thus, the crystallization of the first host material can be prevented by the second host material.

The second host material may have weight ratio of 0.1 to 10 with respect to the first host material having weight ratio of 1. If the second host material having weight ratio of less than 0.1 is mixed with the first host material having weight ratio of 1, the first host material may be crystallized, where if the second host material having weight ratio of more than 10 is mixed with the first host material having weight ratio of 1, the second host material may be crystallized. Preferably, in order to improve the device characteristics, the second host material has weight ratio of 0.3 to 3 with respect to the first host material having weight ratio of 1.

As described above, the first host material which is used in the process of fabricating the typical OELD device using the LITI is easily crystallized by heat and has hole transporting characteristic. Thus, by mixing the second host material which can suppress crystallization of the first host material, is amorphous and has electron transporting characteristic with the first host material, crystallization by heat can be suppressed, and device characteristics such as luminous efficiency can be improved.

The phosphorescent dopant may be formed of an organic metal complex containing one selected from a group comprised of Pt, Ir, Tb, Pt, and Eu.

At least one of a gas generation layer, a buffer layer, and a metal reflecting layer may be further formed between the light-to-heat conversion layer 202 and the transfer layer 203 to improve transfer characteristics.

The gas generation layer absorbs light or heat to cause decomposition reaction to emit nitrogen gas or hydrogen gas to provide transfer energy, and may be made of pentaerythritol tetranitrate (PETN) or trinitrotoluene (TNT).

The buffer layer prevents the transfer layer from being contaminated or damaged by a light-heat absorbing material in a subsequent process and controls adhesive force to the transfer layer to thereby improve the transfer pattern characteristics. The buffer layer may be formed of a metal oxide, a non-metal inorganic compound or an inactive polymer.

The metal reflecting layer serves not only to reflect the laser irradiated to the base layer of the donor substrate so that much energy may be transferred but also to prevent the gas generated in the gas generation layer from moving to the transfer layer 203 in case where the gas generation layer is arranged.

Figure 1C:
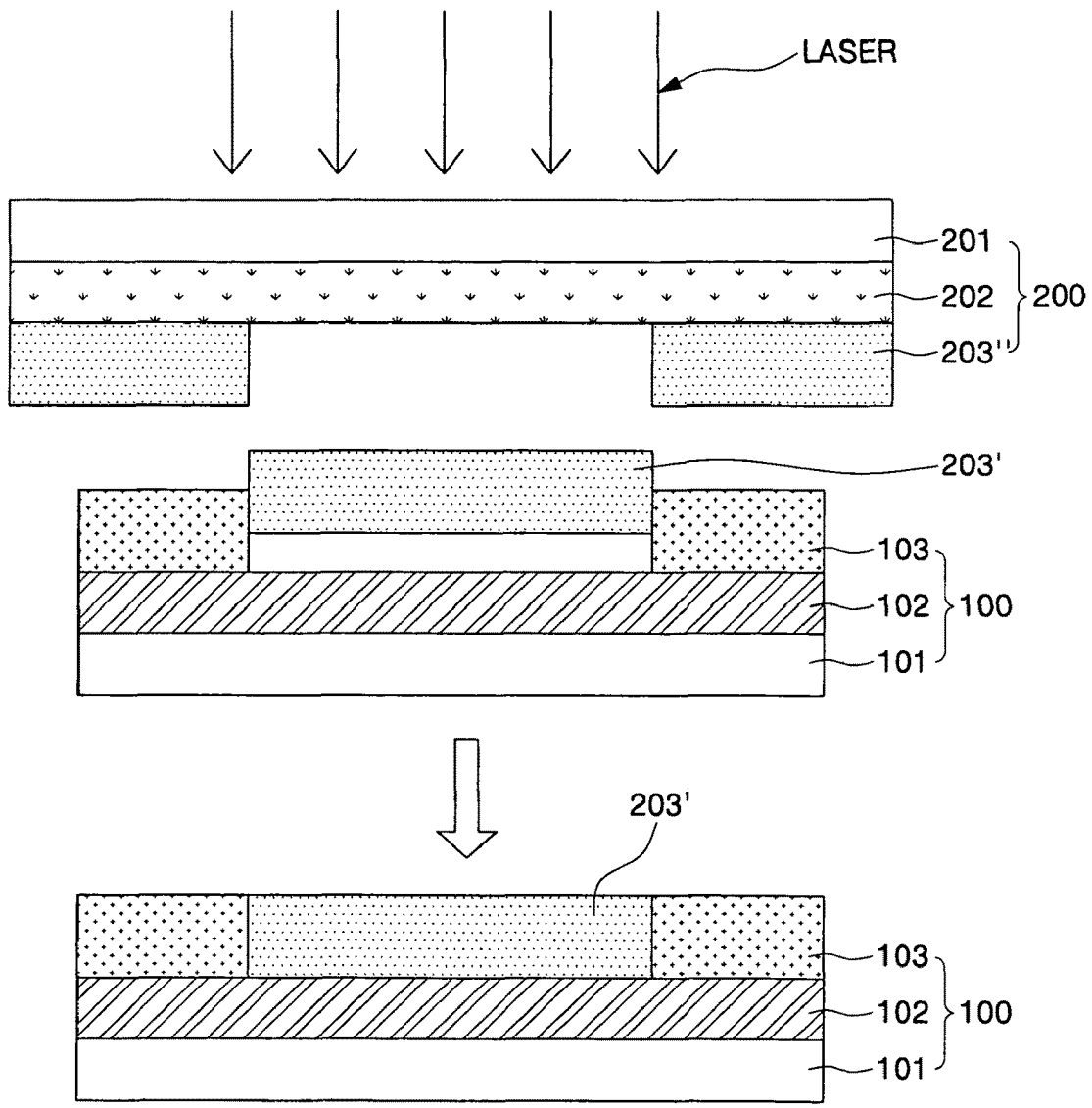

Subsequently, as shown in FIG. 1C, a laser is irradiated to the donor substrate 200 attached to the pixel region of the substrate 100 to transfer a light emitting material to the pixel region of the substrate 100, and then the donor substrate 200 is removed, thereby forming a light emitting layer 203'.

The R, G and B light emitting layers can be formed by irradiating the laser to the donor substrate having R, G and B organic light emitting materials to be transferred to the R, G and B pixel regions, whereby the full color OELD device can be fabricated.

In case where the first electrode is an anode, a hole injecting layer and/or a hole transporting layer may be further formed on the first electrode before forming the light emitting layer 203'. One or more of a hole blocking layer, an electron transporting layer and an electron injecting layer may be further formed on the light emitting layer.

In case where the first electrode is a cathode, an electron transporting layer and/or an electron injecting layer may be further formed on the first electrode before forming the light emitting layer. A hole injecting layer and/or a hole transporting layer may be further formed on the light emitting layer.

The hole injecting layer is located on the anode and is made of a material having high interface adhesive force with the anode and low ionization energy and, thus hole injection is easy and device life span is increased. The hole injecting layer may be made of arylamine-based or porphyrin-based metal complex or starburst-type amines. For example, the hole injecting layer may be made of 4,4',4''-tris(3-methylphenylphenylamino)triphenylamine (m-MTDATA), 1,3,5-tris[4-(3-methylphenylphenylamino)phenyl]benzene (m-MTDATB) or phthalocyanine copper (CuPc).

The hole transporting layer serves to convey holes to the light emitting layer and suppresses electrons generated from a second electrode from being moved to the light emitting region, thereby improving the luminous efficiency. The hole transporting layer may be made of an arylene diamine derivative, a starburst-type compound, a biphenyl diamine derivative having a Spiro group, or a ladder type compound. For example, the hole transporting layer may be made of N,N-diphenyl-N,N'-bis(4-methylphenyl)-1,1'-biphenyl-4,4'-diamine (TPD) or 4,4'-bis[N-1-naphthyl]-N-phenylamino]biphenyl (NPB).

The hole blocking layer serves to prevent the luminous efficiency from being dropped because hole mobility is greater than electron mobility in the light emitting layer and life span of a triplet state is lengthy and, thus excitons formed in the light emitting layer are distributed over the wide region. The hole blocking layer may be made of 2-biphenyl-4-yl-5-(4-t-butylphenyl)-1,3,4-oxydiazole (PBD), spiro-PBD or 3-(4'-tert-butylphenyl)-4-phenyl-5-(4'-biphenyl)-1,2,4-triazole (TAZ).

The electron transporting layer is stacked on the organic light emitting layer and is made of a metal compound which can receive electrons such as 9-hydro quinoline aluminum salt (Alq3).

The electron injecting layer may be made of one selected from a group comprised of 1,3,4-oxydiazole derivative, 1,2,4-triazole derivative and LiF. The organic layer may be formed using a spin coating method or a deposition method or at the same time as the laser is irradiated to form the transfer layer of the donor substrate after one of the organic light emitting layer and the organic layer is stacked on the other.

Figure 1D:
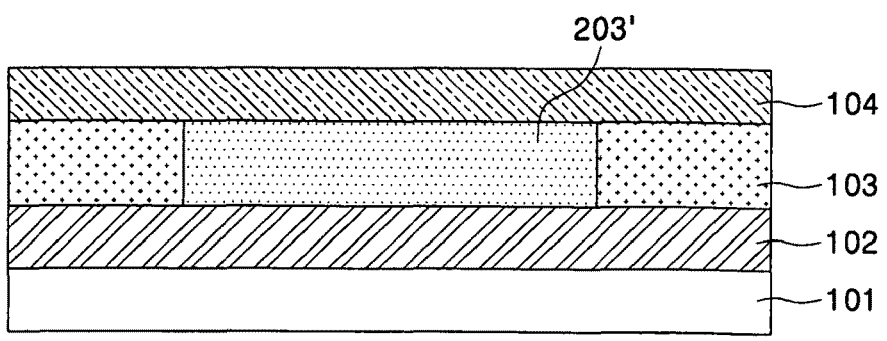

Then, as shown in FIG. 1D, a second electrode 104 is formed on the organic layer. The second electrode may be an anode or a cathode.

In case where the second electrode 104 is a cathode, a thin transparent electrode or a thick reflecting electrode is formed on the organic layer. The transparent electrode is made of a conductive material having low work function selected from a group comprised of Mg, Ca, Al, Ag, and alloy of these.

An upper portion of the second electrode is preferably sealed by a metal can and a sealing substrate, thereby completing the OELD device.

In the above described embodiment, the light emitting layer is formed using the LITI. The method of forming the light emitting layer is not limited to this but includes a vacuum deposition, a spray coating and an ink jet printing.

Hereinafter, the present invention is explained with reference to the below examples, but the present invention is not limited to the below embodiment.

Examples 1 to 3 and Comparison Examples 1 to 4

After a cleaning and drying process, N,N'-di(1-naphthyl)-N,N'-diphenylbenzidene (NPD) which serves as a hole injecting layer and a hole transporting layer is deposited on an ITO transparent electrode at thickness of 50 nm in vacuum of $10^{-6}$ Torr.

Iridiumbis(2-phenylquinoline)acetylacetonate (Ir(pq)2acac) which is a phosphorescent dopant is doped at the concentration of 5% w/w to a host material of 4,4'-biscarbazolybiphenyl (CBP) and biphenoxy-bi(8-quinolinolato)aluminum (BAlq) which are mixed at a ratio stated in Table 1 to form the light emitting layer at thickness of 30 nm, thereby fabricating the donor substrate.

N,N'-di(1-naphthyl)-N,N'-diphenylbenzidene (NPD) of the substrate is arranged to face the transfer layer of the donor substrate and laminated, and then the laser is irradiated to the donor substrate, so that the transfer layer, i.e., the light emitting layer of the donor substrate is transferred to the substrate. Thereafter, biphenoxy-bi(8-quinolinolato)aluminum (BAlq) is deposited at thickness 5 nm as the hole blocking layer, and tris(8-quinolinolato)aluminum (Alq) is deposited at thickness of 20 nm as the electron transporting layer, and then lithium fluoride is deposited at thickness of 1 nm in vacuum of $10^{-6}$ Torr. Finally, Al is deposited on the hole injecting layer of the lithium fluoride at thickness of 300 nm as the metal electrode, and a sealing is performed using the metal can and barium oxide.

Figure 2A:
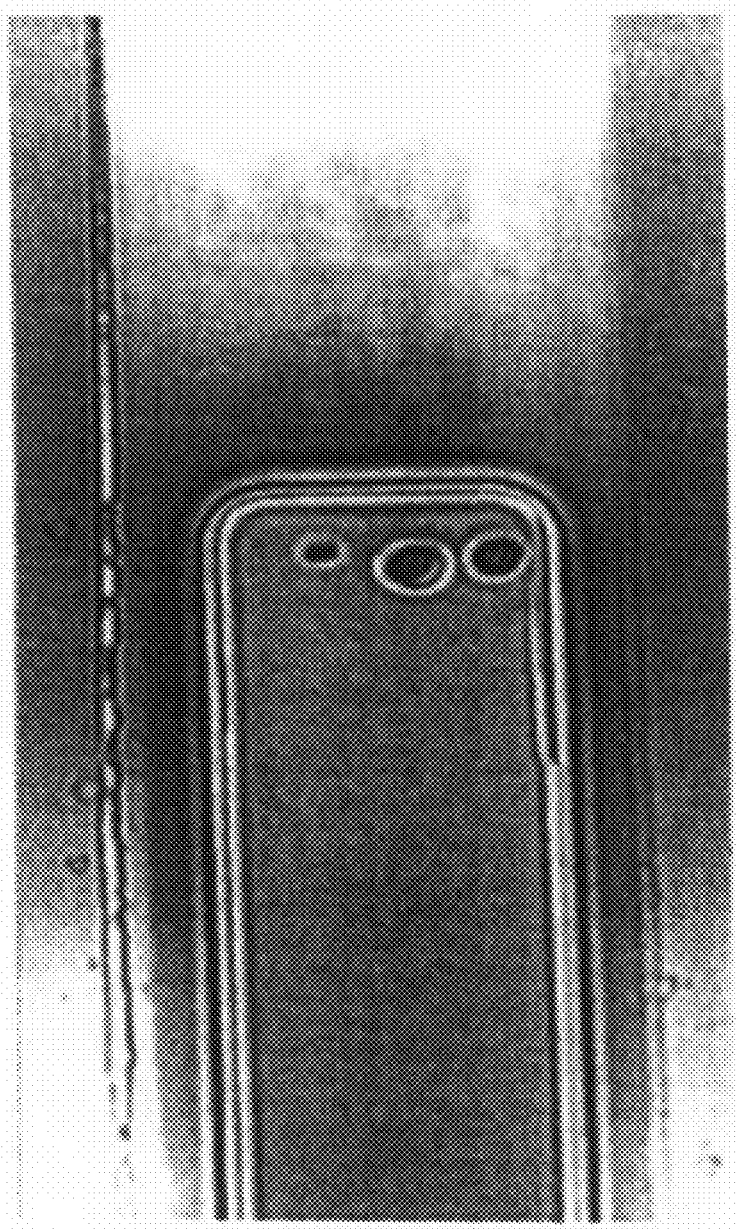
FIGS. 2A and 2B are microscope photographs illustrating the light emitting layer patterns of the OELD devices of the example 1 and the comparison example 4 which are formed by the LITI.
Figure 2B:
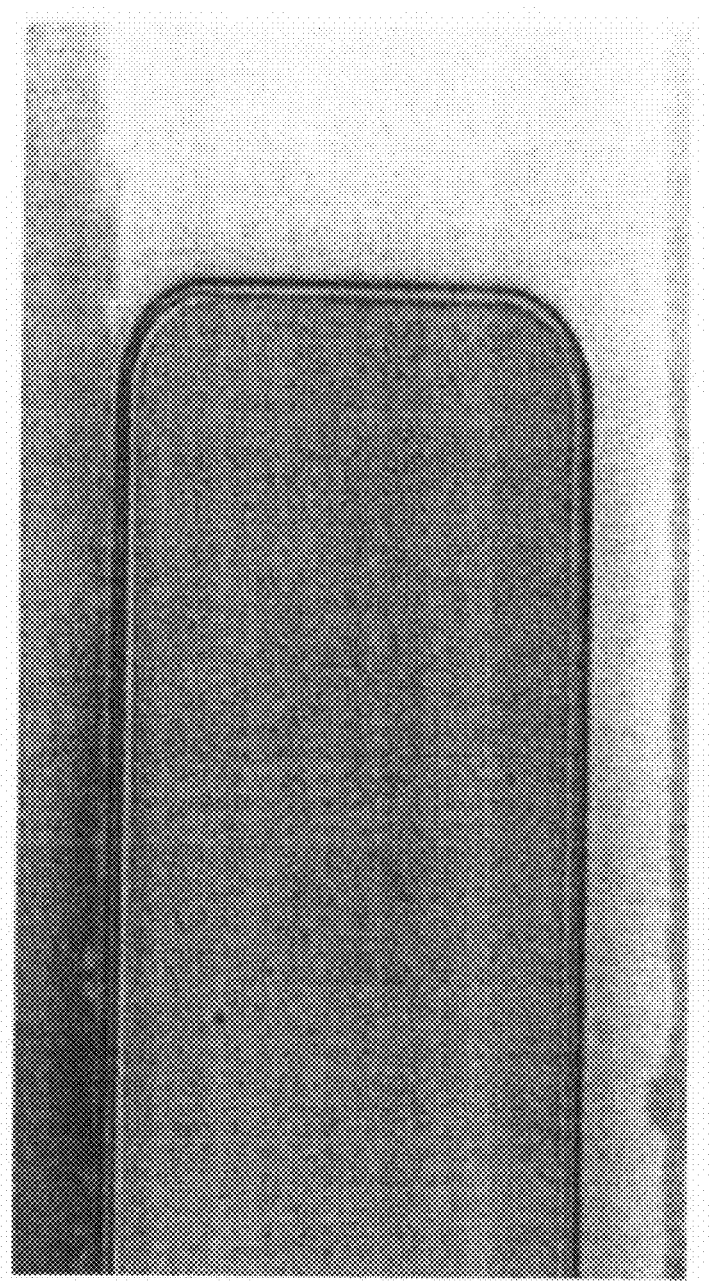

FIGS. 2A and 2B are microscope photographs illustrating the light emitting layer patterns of the OELD devices of the example 1 and comparison example 4 which are formed by the LITI.

Referring to FIG. 2A, it can be seen that crystallization occurs in the light emitting layer of the comparison example 4 which contains a single host material. Referring to FIG. 2B, it can be seen that crystallization does not occurs in the light emitting layer of the example 1 which contains two host materials mixed. Also, it can be seen that the light emitting layer pattern of the example 1 is more uniformly formed than that of the comparison example 4.

Table 1 shows characteristics of the OELD devices according to the examples 1 to 3 and the comparison examples 1 to 4.

TABLE 1

| | Light emitting layer material | | | |
|---|---|---|---|---|
| | first host material (CBP) | second host material (Balq) | Efficiency cd/A | Life Span (@ 1,000 cd/m²) |
| Example 1 | 25 | 75 | 9 | 5,000 h |
| Example 2 | 50 | 50 | 8 | 4,000 h |

TABLE 1-continued

| | Light emitting layer material | | | |
|---|---|---|---|---|
| | first host material (CBP) | second host material (Balq) | Efficiency cd/A | Life Span (@ 1,000 cd/m²) |
| Example 3 | 75 | 25 | 7 | 3,500 h |
| Com Example 1 | 0 | 100 | 2 | 50 h |
| Com Example 2 | 5 | 95 | 2 | 70 h |
| Com Example 3 | 95 | 5 | 2 | 50 h |
| Com Example 4 | 0 | 100 | 2 | 50 h |

As can be seen in Table 1, the OELD devices of the examples 1 to 3 have 70 to 100 times life span and 3 times efficiency of the OELD devices over the comparison examples 1 to 4. It can be seen that in the low phosphorescent molecular OELD device, the device which contains two host materials which are mixed has more excellent life span characteristic than the device which contains a signal host material, and the device characteristics are improved when the first host material and the second host material are mixed at the weight ratio of 1:0.3 to 1:3.

As described herein before, by forming the light emitting layer using the mixture of two or more host materials, crystallization which may occur during a manufacturing process or device operation can be prevented, thereby reducing inferiority resulting from the device characteristic degradation and device damage.

Also, by adding the host material having the electron transporting characteristic, the OELD device having excellent life span and efficiency can be fabricated.

Furthermore, by the small molecular OELD device using the LITI, crystallization problem can be resolved, thereby achieving excellent display quality and device characteristics, leading to a large-sized OELD device.

What is claimed is:

1. A method of fabricating an organic electroluminescent display device, comprising:
    preparing a target substrate; and
    forming an organic layer on the target substrate, the organic layer including at least a light emitting layer, the organic layer comprising at least one phosphorescent dopant, a first host material, and a second host material, the first host material and the second host material mixed at weight ratio of 1:0.3 to 1:3.

2. The method of claim 1, wherein the light emitting layer is formed using laser induced thermal imaging (LITI).

3. The method of claim 2, wherein the target substrate comprises an insulating substrate, a first electrode on the insulating substrate, and a pixel defining layer on the first electrode, and the step of forming the organic layer comprises:
    preparing a donor substrate comprising a base layer, a light-to-heat conversion layer formed on the base layer, and a transfer layer formed on the light-to-heat conversion layer, the transfer layer comprising at least one phosphorescent dopant, a first host material and a second host material;
    positioning the transfer layer of the donor substrate to face the pixel defining layer of the target substrate; and
    irradiating a predetermined region of the donor substrate with laser to transfer the transfer layer to the target substrate.

4. The method of claim 1, wherein the first host material is at least one selected from the group consisting of carbazoles, arylamines, hydrazones, and starbursts.

5. The method of claim 1, wherein the second host material is at least one selected from the group consisting of an organic metal, oxadiazoles, triazoles, triazines, and spirofluorenes.

6. A donor substrate, comprising:
    a base layer;
    a light-to-heat conversion layer formed on the base layer; and
    a transfer layer formed on the light-to-heat conversion layer, the transfer layer comprising at least one phosphorescent dopant, a first host material and a second host material, the first host material and the second host material mixed at weight ratio of 1:0.1 to 1:10, the first host material selected from the group consisting of 1,3,5-triscarbazolylbenzene, 4,4'biscarbazolylbiphenyl, polyvinylcarbazole, m-biscarbazolylphenyl, 4,4'-biscarbazolyl-2,2'-dimethylbiphenyl, 4,4',4''-tri(N-carbazolyl) triphenylamine, 1,3,5-tris(2-carbazolylphenyl) benzene, 1,3,5-tris(2-carbazolyl-5-methoxyphenyl) benzene, and bi(4-carbazolylphenyl)silane.

7. The substrate of claim 6, wherein the second host material suppresses crystallization occurrence of the first host material and has electron transporting characteristics.

8. The substrate of claim 6, wherein the first host material is at least one selected from the group consisting of carbazoles, arylamines, hydrazones, and starbursts.

9. The substrate of claim 6, wherein the second host material is at least one selected from the group consisting of an organic metal, oxadiazoles, triazoles, triazines, and spirofluorenes.

10. The substrate of claim 6, wherein the first host material and the second host material are mixed at weight ratio of 1:0.3 to 1:3.

11. The substrate of claim 6, further comprising at least one of a gas generation layer, a buffer layer, and a metal reflecting layer between the light-to-heat conversion layer and the transfer layer.

12. The donor substrate of claim 6, wherein the phosphorescent dopant is an organic metal complex containing one selected from the group consisting of Pt, Ir, Tb, and Eu.

13. The donor substrate of claim 6, wherein the second host material is selected from the group consisting of bis(8-hydroxyquinolato)biphenoxy aluminum, bis(8hydroxyquinolato)phenoxy aluminum, bis(2-methyl-8-hydroxyquinolato) biphenoxy aluminum, bis(2-methyl-8-hydroxyquinolato) phenoxy aluminum, bis(2-(2-hydroxyphenyl)quinolato)zinc, (4-biphenylyl)-5-(4-tertbutylphenyl)-1,3,4-oxadiazole, 3-phenyl-4-(1'-naphthyl)-5-phenyl-1,2,4-triazole, 2,9-dimethyl-4,7-diphenyl-9,10-phenanthroline, 2,4,6-tris (diallylamino)-1,3,5-trazin and 1,4-bisspirofluorenylbenzene.

14. A donor substrate, comprising:
    a base layer;
    a light-to-heat conversion layer formed on the base layer; and
    a transfer layer formed on the light-to-heat conversion layer, the transfer layer comprising at least one phosphorescent dopant, a first host material and a second host material, the first host material and the second host material mixed at weight ratio of 1:0.3 to 1:3.

* * * * *